(12) United States Patent
Hess et al.

(10) Patent No.: US 9,230,690 B2
(45) Date of Patent: Jan. 5, 2016

(54) REGISTER FILE WRITE RING OSCILLATOR

(71) Applicant: Apple Inc., Cupertino, CA (US)

(72) Inventors: Greg M Hess, Mountain View, CA (US); James E Burnette, II, San Jose, CA (US)

(73) Assignee: Apple Inc., Cupertino, CA (US)

( * ) Notice: Subject to any disclaimer, the term of this patent is extended or adjusted under 35 U.S.C. 154(b) by 500 days.

(21) Appl. No.: 13/670,739

(22) Filed: Nov. 7, 2012

(65) Prior Publication Data

US 2014/0129884 A1 May 8, 2014

(51) Int. Cl.
*G11C 29/50* (2006.01)
*G11C 8/16* (2006.01)

(52) U.S. Cl.
CPC ............ *G11C 29/50012* (2013.01); *G11C 8/16* (2013.01)

(58) Field of Classification Search
CPC .......................... G11C 29/50012; G11C 8/16
See application file for complete search history.

(56) References Cited

U.S. PATENT DOCUMENTS

| | | | |
|---|---|---|---|
| 5,276,837 A * | 1/1994 | Sakaue | 365/230.05 |
| 5,440,749 A | 8/1995 | Moore et al. | |
| 6,067,262 A * | 5/2000 | Irrinki et al. | 365/201 |
| 6,201,754 B1 * | 3/2001 | Ooishi et al. | 365/226 |
| 8,094,505 B2 | 1/2012 | Khellah et al. | |
| 8,261,138 B2 | 9/2012 | Chang et al. | |
| 2008/0082884 A1 * | 4/2008 | Harada | 714/733 |

OTHER PUBLICATIONS

Kulkarni, Jaydeep; Khellah, Muhammad "Capacitive-Coupling Wordline Boosting with Self-Induced VCC Collapse for Write VMIN Reduction in 22-nm 8T SRAM;" 2012 IEEE International Solid-State Circuits Conference (ISSCC), 978-1-4673-0377, Feb. 19-23, 2012; pp. 234-236.

* cited by examiner

*Primary Examiner* — Vanthu Nguyen
*Assistant Examiner* — Khamdan Alrobaie
(74) *Attorney, Agent, or Firm* — Meyertons, Hood, Kivlin, Kowert & Goetzel, P.C.

(57) ABSTRACT

Embodiments of a register file test circuit are disclosed that may allow for determining write performance at low power supply voltages. The register file test circuit may include a decoder, a multiplexer, a frequency divider, and a control circuit. The decoder may be operable to select a register cell within a register file, and the control circuit may be operable to controllably activate the read and write paths through the selected register cell, allowing data read to be inverted and re-written back into the selected register cell.

9 Claims, 8 Drawing Sheets

REGISTER FILE WRITE RING OSCILLATOR

BACKGROUND

1. Technical Field

This invention is related to the field of processor implementation, and more particularly to the implementation and testing of register files.

2. Description of the Related Art

Computing systems may include one or more systems on a chip (SoC), which may integrate a number of different functions, such as, graphics processing, and memories onto a single integrated circuit. With numerous functions included in a single integrated circuit, chip count may be kept low in mobile computing systems, such as tablets, for example, which may result in a smaller form factor for such mobile computing systems.

SoCs typically include a number of data storage blocks of various storage capacities. Typically, large data storage blocks may be implemented as static random access memories (SRAMs) or dynamic random access memories (DRAMs). In some cases, smaller data storage blocks may be implemented as register files, whose data storage cells may be implemented according to one of various design styles.

During the semiconductor manufacturing process, variations in lithography, transistor dopant levels, etc., may result in different electrical characteristics between data storage cells that are intended to have identical characteristics. Additional variation in electrical characteristics may occur due to aging effects within the transistors as the device is repeatedly operated. These differences in electrical characteristics between transistors can result in data storage cells, such as those used in implementing register files, requiring different amounts to time to store data into the cells.

In some cases, the variation within data storage cells, as well as changes in power supply voltage, may result in a processor or SoC not being able to store data into a data storage cell within a pre-determined clock cycle period. Such data storage cells may be identified as failures during testing and may require re-design in order to achieve manufacturing yield goals.

SUMMARY OF THE EMBODIMENTS

Various embodiments of circuit for testing a register file on an integrated circuit are disclosed. Broadly speaking, a circuit and a method are contemplated in which, at various power supply voltages, data may be read from a selected register cell within a register file. The read data may be inverted and stored back into the selected register cell. The stored inverted data may then be re-read from the selected register cell. The activation of a read port of the selected register cell may be dependent upon the inverted read data.

In one embodiment, the circuit for testing may include a frequency divider. The frequency divider may be configured to generate a test output dependent upon the read data. The frequency of the test output may be less than the frequency of the read data.

In a further embodiment, a read-write oscillation frequency may be measured through the selected register cell. A read oscillation frequency may also be measure through the selected register cell. A write oscillation frequency may be calculated dependent upon the measure read-write and read oscillation frequencies.

BRIEF DESCRIPTION OF THE DRAWINGS

The following detailed description makes reference to the accompanying drawings, which are now briefly described.

Figure 1:
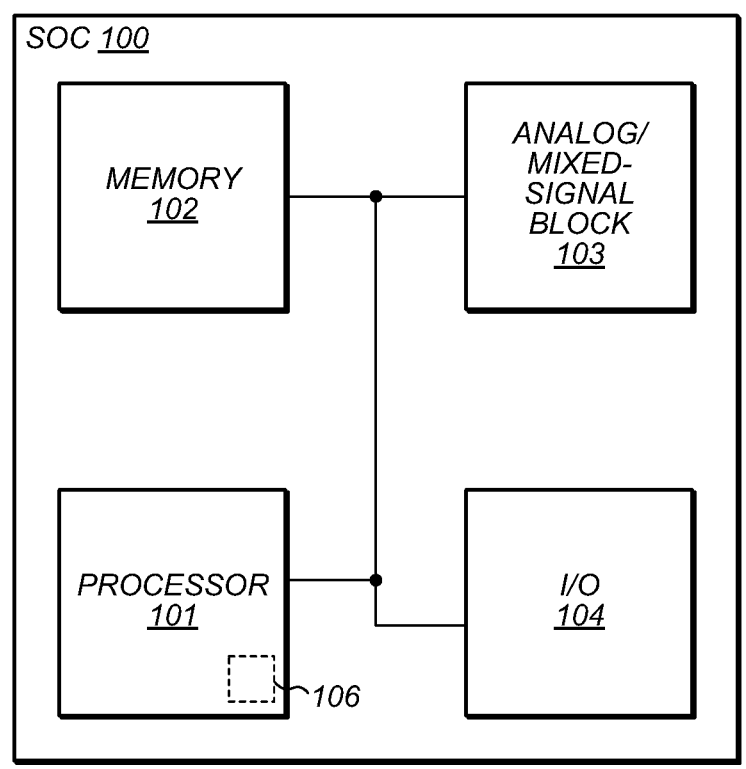
FIG. 1 illustrates an embodiment of a system on a chip.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component. More generally, the recitation of any element is expressly intended not to invoke 35 U.S.C. §112, paragraph six interpretation for that element unless the language "means for" or "step for" is specifically recited.

DETAILED DESCRIPTION OF EMBODIMENTS

A system on a chip (SoC) may include one or more functional blocks, such as, e.g., a microcontroller or a processor, which may integrate the function of a computing system onto a single integrated circuit. Processors or microcontrollers may employ registers or register files to store small amounts of data that may need to be accessed repeatedly. Prior to the inclusion of a register or register file in an SoC design, some or all of the circuits included in the register or register file, such as data storage cells, for example, may be fabricated on a test chip or process control module to gather data regarding the performance and yield of the circuits. The embodiments illustrated in the drawings and described below may provide techniques for testing register file data storage cells to determine failure limits of the storage cells at low supply voltages.

A block diagram of an SoC is illustrated in FIG. 1. In the illustrated embodiment, the SoC 100 includes a processor 101 coupled to memory block 102, and analog/mixed-signal block 103, and I/O block 104 through internal bus 105. In various embodiments, SoC 100 may be configured for use in a mobile computing application such as, e.g., a tablet computer or cellular telephone.

Processing device 101 may, in various embodiments, be representative of a general-purpose processor that performs computational operations. For example, processing device 301 may be a central processing unit (CPU) such as a microprocessor, a microcontroller, an application-specific integrated circuit (ASIC), or a field-programmable gate array (FPGA).

In some embodiments, processing device 101 may implement any suitable instruction set architecture (ISA), such as, e.g., the ARM™, PowerPC™, or x86 ISAs, or a combination thereof. Processing device 101 may include one or more registers or register files.

Memory block 102 may include any suitable type of memory such as a Dynamic Random Access Memory (DRAM), a Static Random Access Memory (SRAM), a Read-only Memory (ROM), Electrically Erasable Programmable Read-only Memory (EEPROM), or a FLASH memory, for example. It is noted that in the embodiment of an SoC illustrated in FIG. 1, a single memory block is depicted. In other embodiments, any suitable number of memory blocks may be employed.

Analog/mixed-signal block 103 may include a variety of circuits including, for example, a crystal oscillator, a phase-locked loop (PLL), an analog-to-digital converter (ADC), and a digital-to-analog converter (DAC) (all not shown). In other embodiments, analog/mixed-signal block 103 may be configured to perform power management tasks with the inclusion of on-chip power supplies and voltage regulators. Analog/mixed-signal block 103 may also include, in some embodiments, radio frequency (RF) circuits that may be configured for operation with cellular telephone networks.

I/O block 104 may be configured to coordinate data transfer between SoC 101 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, I/O block 104 may be configured to implement a version of Universal Serial Bus (USB) protocol or IEEE 1394 (Firewire®) protocol.

I/O block 104 may also be configured to coordinate data transfer between SoC 101 and one or more devices (e.g., other computer systems or SoCs) coupled to SoC 101 via a network. In one embodiment, I/O block 104 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, I/O block 104 may be configured to implement multiple discrete network interface ports.

Figure 2:
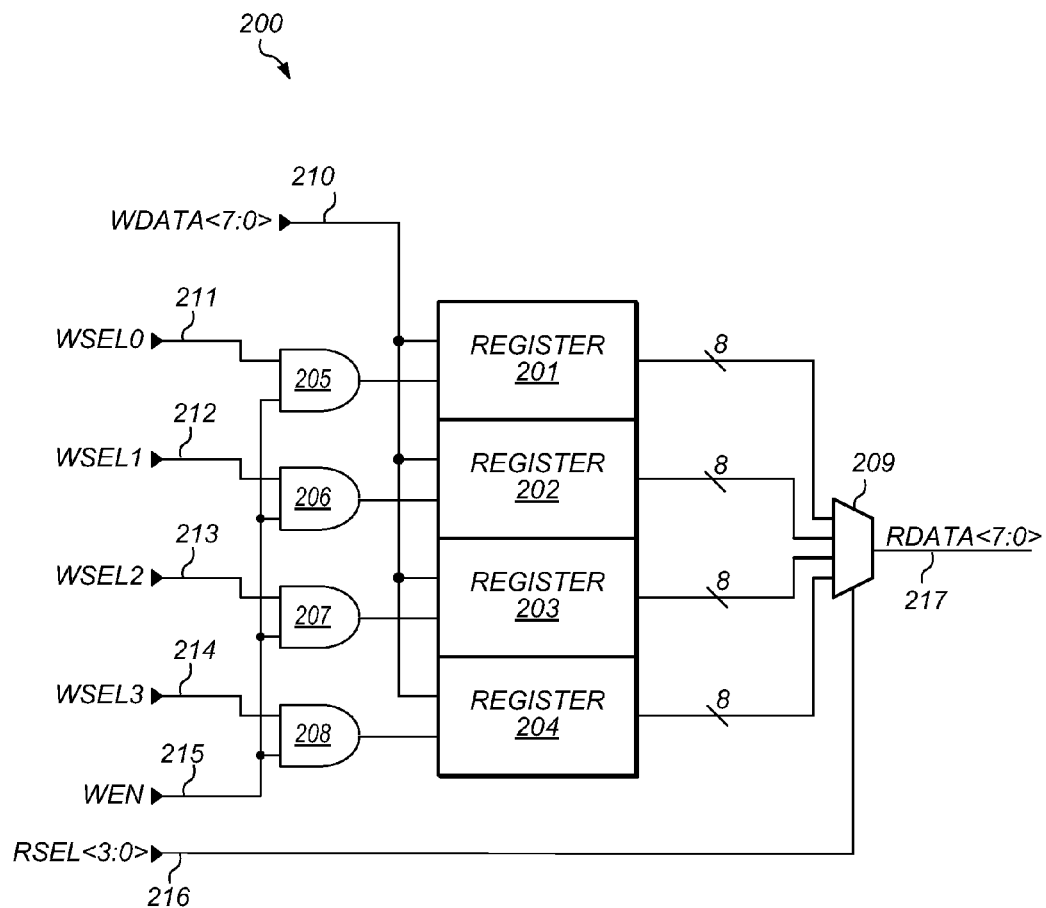
FIG. 2 illustrates an embodiment of a register file.

Turning to FIG. 2, a register file is illustrated according to one of several possible embodiments. In some embodiments, register file 200 may correspond to register file 106 embedded within processor 101 included in SoC 100 as depicted in FIG. 1. The illustrated embodiment includes write data inputs 210 denoted as "wdata<7:0>," write enable input 215 denoted as "wen," write selection inputs 211-214 denoted as "wsel0" through "wsel3," read selection inputs 216 denoted as "rsel<3:0>," and read data outputs 217 denoted as "rdata<7:0>."

In the illustrated embodiment, write data input 210 is coupled registers 201 through 204. Write selection inputs 211-214 are coupled to AND gates 205 through 208, respectively. The outputs of registers 201 through 204 are coupled to multiplex circuit 209, which is controlled by read selection inputs 216.

In the embodiment illustrated in FIG. 2, each of registers 201 through 204 include eight register cells coupled in parallel to a common read select line and a common write select lines. It is noted that in other embodiments, different numbers of register cells may be included in registers 201 through 204. The register cells may include a D-type flip-flop, cross-coupled inverters, or any suitable static storage circuit, and may be configured with one or more read ports and one or more write ports.

Multiplex circuit 209 may include a plurality of tri-state buffers whose outputs are coupled together in a wired-OR fashion, and whose control input is dependent upon one of the read selection inputs 216. In some embodiments, multiplex circuits 209 may include a plurality of logic gates configured to implement the desired multiplex function.

Static AND gates, such as those shown and described herein, may be implemented according to several design styles. For example, an AND gate may be implemented as a NAND gate whose output is coupled to an inverter. In other embodiments, an AND gate may be constructed from multiple NAND gates, multiple NOR gates, or any suitable combination of logic gates.

During read operation, one of read selection inputs 216 may be asserted, thereby selecting the outputs of the corresponding one of registers 201 through 204 to be coupled to the read data outputs 217. During a write operation, data to be stored in register file 200 may be presented on write data inputs 210. One of registers 201 through 204 may then be selected by asserting one of write selection inputs 211 thought 214. Write enable input 215 may then be asserted, which is combined with the asserted one of wire selection inputs 211 through 214 by the corresponding one of AND gates 205 through 208, thereby storing data in the corresponding register 201 through 204.

It is noted that the register file illustrated in FIG. 2 is merely an example. In other embodiments, different numbers of registers and different widths of registers are possible and contemplated.

Figure 3:
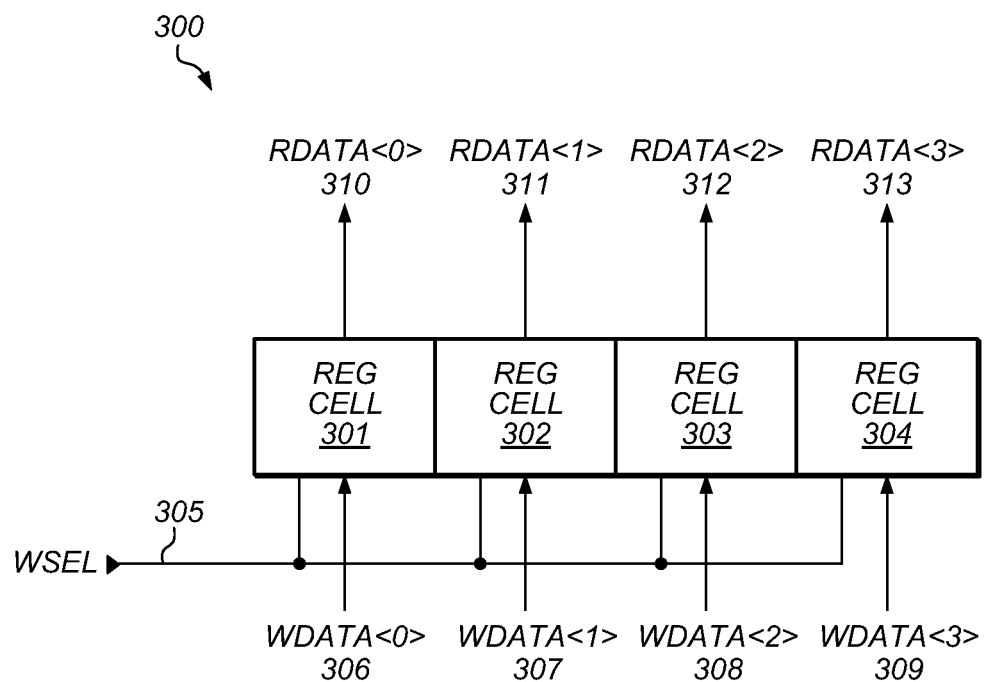
FIG. 3 illustrates an embodiment of a register.

Turning to FIG. 3, an embodiment of a register is illustrated. In the illustrated embodiment, register 300 includes write select input 305 denoted as "wsel," write data inputs 306 through 309 denoted as "wdata<0>," "wdata<1>," "wdata<2>," and "wdata<3>," and read data outputs 310 through 313 denoted as "rdata<0>," "rdata<1>," "rdata<2>," and "rdata<3>." Register 300 may correspond, in some embodiments, to registers 201 through 204 in register file 200 as illustrated in FIG. 2.

In the embodiment illustrated in FIG. 3, write selection input is coupled to each of register cells 301 through 304. Write data inputs 306 through 309 are coupled to register cells 301 through 304, respectively, and read data outputs 310 through 313 are also coupled to register cells 301 through 304, respectively. Register cells 301 through 304 may be implemented in accordance to one of various design styles, such as, register cell 400 as illustrated in FIG. 4, for example.

During operation, a data word to be stored in the register may be presented on write data inputs 306 through 307, each bit of the data word corresponding to a respective write data input. Write select input 305 may then be asserted, storing each bit of the data word into its respective register cell. Once the data word has been stored, the read data outputs 310 through 313 may change state to reflect the newly stored data, again, each read data output corresponding to a bit of an output data word. Although register 300 is depicted as being able to store a four-bit word, in various embodiments, register 300 may be configured to store different word widths.

Figure 4:
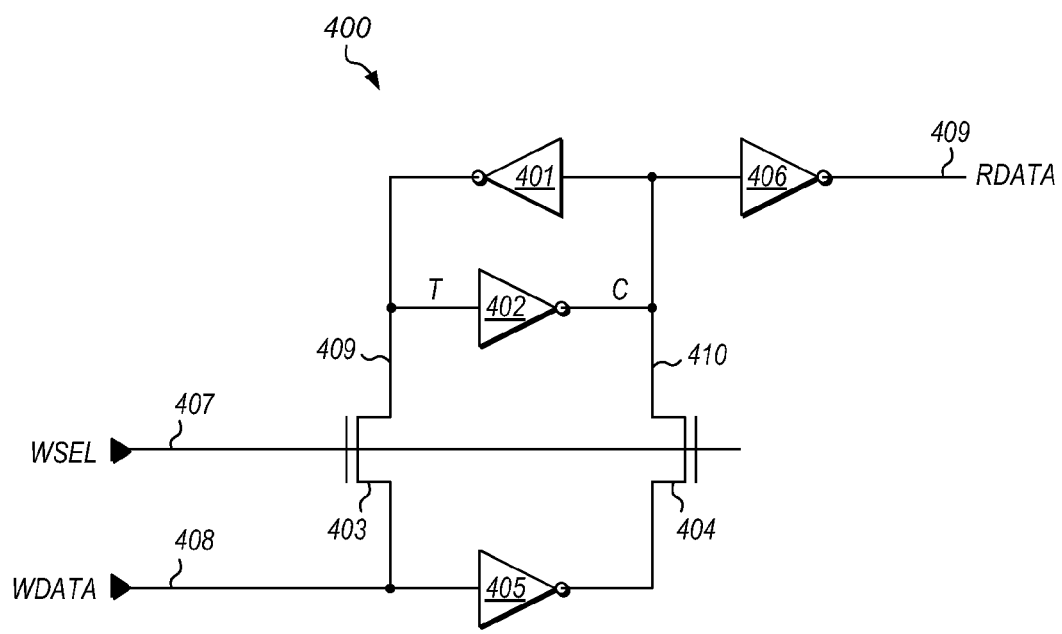
FIG. 4 illustrates an embodiment of a register cell.

An embodiment of a register cell is illustrated in FIG. 4. In the illustrated embodiment, register cell 400 includes write select input 407 denoted as "wsel," write data input 408 denoted as "wdata," and read data output 409 denoted as "rdata." Register cell 400 may, in some embodiments, correspond to register cells 301 through 304 as depicted in register 300 illustrated in FIG. 3.

In the embodiment illustrated in FIG. 4, write select input 407 controls pass devices 403 and 404. Write data input 408 is coupled to pass device 403 and inverter 405, whose output is coupled to pass device 404. Pass device 403 is further coupled to the input of inverter 402 and the output of inverter 401 through true storage node 409, and pass device 404 is further coupled to the output of inverter 402 and the inputs of inverters 401 and 406 through complement storage node 410. The output of inverter 406 is coupled to read data output 409. In various embodiments, additional pass devices controlled by additional write selection inputs may be employed to provide multiple write ports into register cell 400. Additional inverters coupled to either true storage node 409 or complement storage node 410 may be employed to provide multiple read ports from register cell 400.

Inverters 401 and 402 are connected in a fashion commonly referred to as "cross-coupled." The feedback between the two inverters is responsible for the storage of a logical state within register cell 400. Other storage mechanisms, such as, e.g., storing charge on a capacitor, may be also be employed in a register cell.

It is noted that a pass device (also referred to as a "transmission gate") may include an n-channel metal-oxide-semiconductor field-effect transistor (MOSFET) and a p-channel MOSFET connected in parallel. In other embodiments, a single n-channel MOSFET or a single p-channel MOSFET may be used as a pass gate. It is further noted that, in various embodiments, a "transistor" may correspond to one or more transconductance elements such as a junction field-effect transistor (JFET), for example.

Static complementary metal-oxide-semiconductor (CMOS) inverters, such as those shown and described herein, may be a particular embodiment of an inverting amplifier that may be employed in the circuits described herein. However, in other embodiments, any suitable configuration of inverting amplifier that is capable of inverting the logical sense of a signal may be used, including inverting amplifiers built using technology other than CMOS.

During operation, data to be stored in register cell 400 may be presented on write data input 408. Write select input 407 may then be set to a high logic level, activating pass devices 403 and 404. The data to be stored may then be coupled through pass device 403 onto true storage node 409. Inverter 405 may invert the logical polarity of the data to be stored, which is coupled through pass device 404 onto complement storage node 410. Once the regenerative feedback between inverters 401 and 402 has been re-established with new data, write selection input 407 may be set to a low logic level. The newly stored data may then appear on read data output 409 via inverter 406.

It is noted that "low" or "low logic level" refers to a voltage at or near ground and that "high" or "high logic level" refers to a voltage level sufficiently large to turn on an n-channel MOSFET and turn off a p-channel MOSFET. In other embodiments, different technology may result in different voltage levels for "low" and "high."

It is noted that the embodiment of a register cell illustrated in FIG. 4 is merely an example. In other embodiments, different circuit elements and different configurations of circuit elements may be employed.

Figure 5:
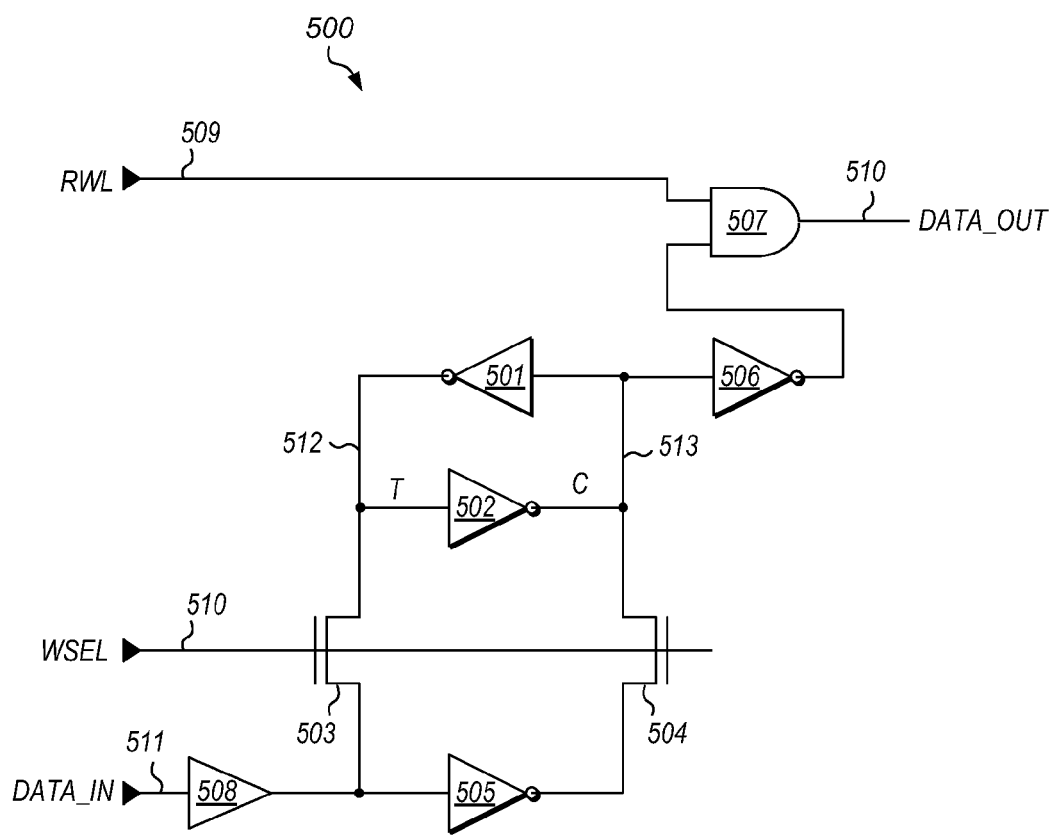
FIG. 5 illustrates an alternative embodiment of a register cell.

Another embodiment of a register cell is illustrated in FIG. 5. The embodiment illustrated in FIG. 5 includes read word line input 509 denoted as "rwl," write select input 510 denoted "wsel," data input 511 denoted "data_in," and data output 510 denoted as "data_out." In some embodiments, register cell 500 may correspond to register cells 301 through 304 as depicted in register 300 illustrated in FIG. 3.

In the illustrated embodiment, write select 510 controls pass devices 503 and 504. Data input 511 is coupled to buffer 508, whose output is coupled to pass device 503 and inverter 505. The output of inverter 505 is coupled to pass device 504, which is, in turn, further coupled to the output of inverter 502, and the inputs of inverters 501 and 506 through complement storage node 513. Pass device 503 is further coupled to the input of inverter 502 and the output of inverter 501 through true storage node 512. The output of inverter 506 is coupled to an input of AND gate 507. Read word line input 509 is coupled to another input of AND gate 507, whose output is coupled to data output 510. In other embodiments, additional AND gates and read word line inputs may be employed to provide multiple read ports for register cell 500.

It is noted that Static complementary metal-oxide-semiconductor (CMOS) buffers, such as those shown and described herein, may be a particular embodiment of an non-inverting amplifier that may be employed in the circuits described herein. However, in other embodiments, any suitable configuration of non-inverting amplifier that is capable of providing unity gain amplification of a signal may be used, including non-inverting amplifiers built using technology other than CMOS.

Data may be stored into register cell 500 in a similar fashion as described above in reference to register cell 400 illustrated in FIG. 4. In order to access data stored in register cell 500, read word line input 509 may be set to a high logic level, thereby activating AND gate 507 and allowing the output of inverter 506 to propagate to data output 510. When read word line input 509 is at a low logic level, data output 510 may be at a low logic level.

Register cell 500 is merely an example. In various embodiments, different circuit elements and different data storage mechanisms may be employed.

Figure 6:
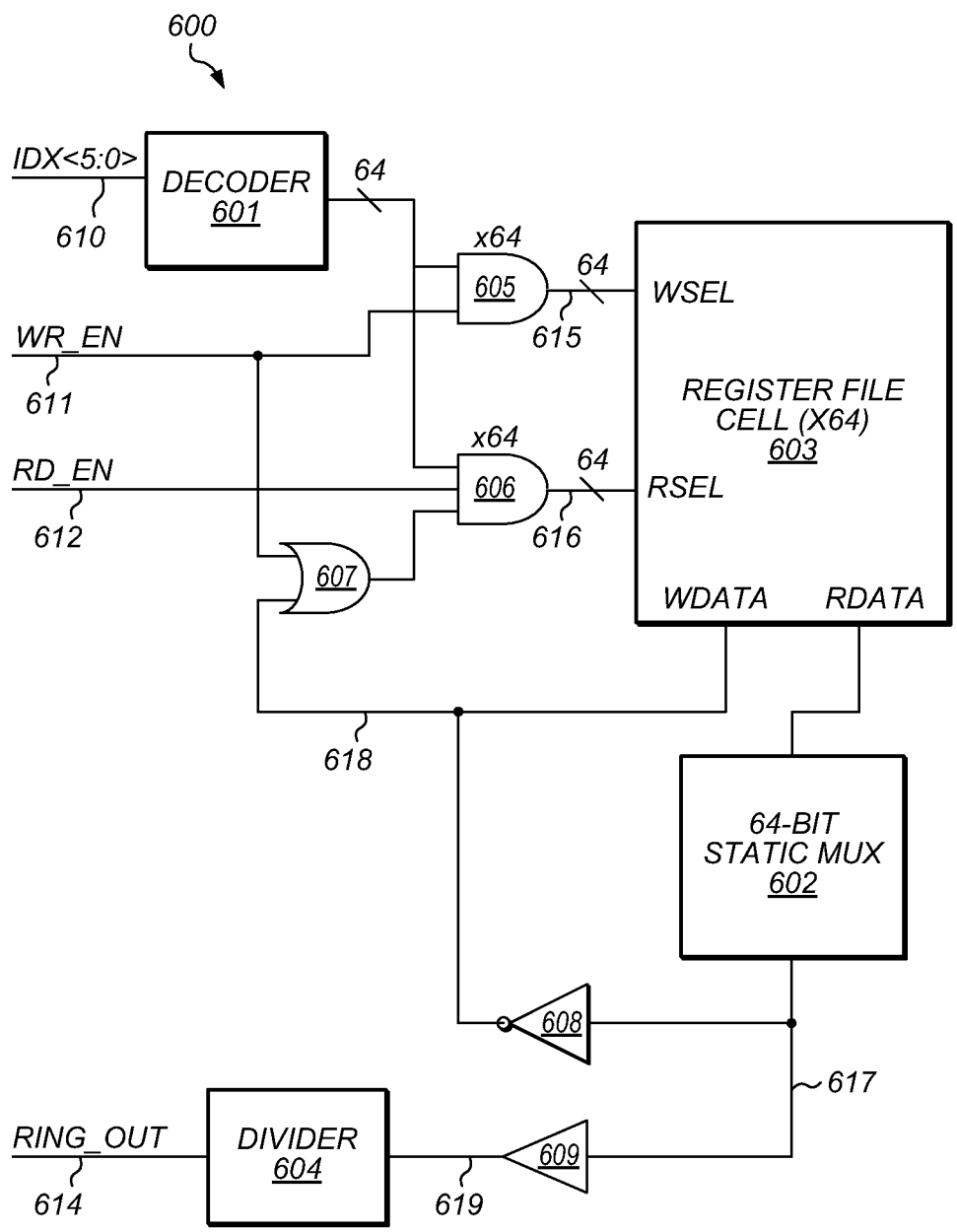
FIG. 6 illustrates an embodiment of a register file test circuit.

Turning to FIG. 6, an embodiment of a register file test circuit is illustrated. The embodiment illustrated in FIG. 6 includes selection inputs 610 denoted as "idx<5:0>," write enable input 611 denoted as "wr_en," read enable input 612 denoted as "rd_en," and oscillator output 614 denoted as "ring_out." Test circuit 600 may be included as part of a process control module (PCM) to fabricated on a semiconductor manufacturing process along with one or more integrated circuits. In other embodiments, test circuit 600 may be included in a processing device or SoC.

In the illustrated embodiment, selection inputs 610 are coupled to decoder 601, whose output is coupled to AND gates 605 and 606. Write enable input 611 is coupled to AND gates 605 and OR gate 607, whose output is coupled to AND gates 606. Read enable input 612 is coupled to AND gate 606. The outputs of AND gates 605 are coupled to the write selection inputs ("WSEL") of respective register cells in register file cells 603. The outputs of AND gates 606 are coupled to the read selection inputs ("RSEL") of respective register cells in register file cells 603.

Each of read data ports ("RDATA") of register file cells 603 is coupled to an input of static mux 602, whose output is coupled inverter 608 and buffer 609. The output of inverter 608 is coupled to OR gate 607 and the write data port ("WDATA") of register file cells 603. In some embodiments all of the write data ports for each register cell of register file cells 603 may be coupled together. The output of buffer 609 is coupled to divider 604, whose output is coupled to oscillator output 614. Although test circuit 600 depicts 64 register file cells, in other embodiments, different number of cells may be employed.

Decoder 601 may be implemented in accordance to one of various design styles. For example, decoder 601 may be implemented using static CMOS logic gates. Alternatively, decoder 601 may be implemented as a dynamic decoder employing collections of n-channel MOSFETs to discharge, in response to selection inputs 610, one or more dynamic circuit nodes that have been pre-charged to a high logic level.

Divider 604 may be implemented as a digital divider employing one or more counters or other suitable state machines to toggle the output of divider 604 after so many edges of the input have been detected. In other embodiments, divider 604 may be implemented as an analog frequency divider such as, a regenerative frequency divider, for example.

During operation, which will be described in more detail below in reference to the flowchart illustrated in FIG. 8, a register file cell of register file cells 603 may be selected by asserting a combination of high and low logic levels on selection inputs 610. Decoder 601 may then translate the input logic levels to assert one of 64 output lines.

In some embodiments, write enable input 611 and read enable input 612 may both be set to a high logic level, enabling AND gates 605 and 606. Data outputs from the register file cells 603 may be combined through static mux 602. In various embodiments, only one data output from register file cells 603 may be active as the outputs of the remaining register files cells may be held inactive by the read selection lines.

The logical polarity of the output of static mux 602 may be inverted by inverter 608. The inverted data on node 618 may then be re-written into the previously selected register file cell. Since the read path is still active, the process (reading data, inverting data, re-writing data) continues, producing an oscillation through the selected register cell.

The oscillating data output from static mux 602 may be amplified by buffer 609. Buffer 609 may have unity gain or any other suitable gain necessary to preserve the signal integrity of the output of static mux 602. Divider 604 may generate a reduce frequency version of the output of buffer 604 to be output as oscillator output 614.

In other embodiments, read enable input 612 may be set to a high logic level and write enable input may be set to a low logic level, setting the outputs of AND gates 605 to a low logic level, thereby disabling the write path into each register cell of register cells 603. In a similar fashion as described above, data read from the selected register file cell in register file cells 603 flows through static mux 602, and is inverted by inverter 608. The inverted data may then change the state of the output of OR gate 607. For example if the data on node 618 transitions from a high logic level to a low logic level, the output of OR gate 607 may transition from a high logic level to a low logic level. A low logic level output from OR gate 607 may set the outputs of AND gates 606 to a low logic level, thereby disabling the read path from the selected register file cell.

In some embodiments, when the read path is disabled the output of the selected register file cell may transition to a low logic level. The low logic level may then flow static mux 602, and may then be inverted by inverter 608, which in turn, sets the output of OR gate 607 to a high logic level. AND gates 606 may then be re-enabled and the read path for the selected register file cell may then be re-enabled. The process continues, generating an oscillation (with a different frequency from the previously described oscillation) through the read path of the selected register file cell. The read path oscillation frequency may also be divided by divider 604 to generate oscillator output 614. It is noted that a pre-determined logic level may need to be stored in the selected register file cell in order to enable the oscillation.

It is noted that the test circuit illustrated in FIG. 6 is merely an example. In other embodiments, different circuit blocks and different configurations of circuit blocks are possible and contemplated.

Figure 7:
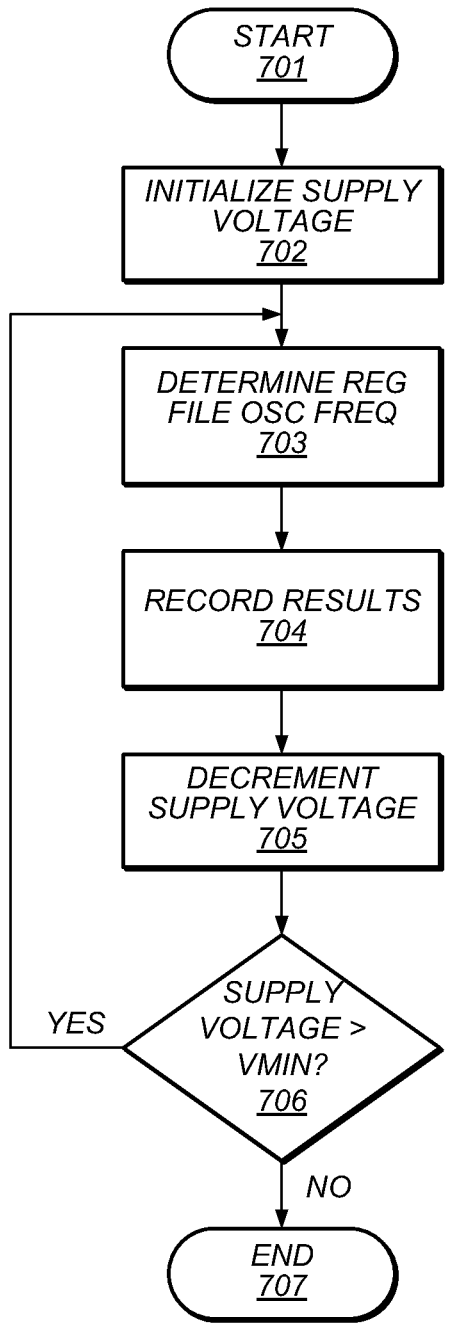
FIG. 7 illustrates a flowchart of an example method of testing a register file.

A flowchart depicting a method for testing a register file within an integrated circuit or SoC utilizing a test circuit such as, e.g., test circuit 600 depicted in FIG. 6, is illustrated in FIG. 7. The method begins in block 701. A supply voltage is then initialized for the test (block 702). In some embodiments, the supply voltage may be provided by a test circuit included with an SoC, such as SoC 100, for example. The supply voltage may be generated externally by a tester or any other suitable test hardware.

The frequency of the register file oscillator may then be determined (block 703). In some embodiments, the determination may include the determination of read-write path frequency and a read-path frequency as described below in more detail with respect to FIG. 8.

Results of the test may then be recorded (block 704). In some embodiments, the results may be stored in memory within an SoC (e.g., memory 102 of SoC 100). Alternatively, the test results may be stored in a tester or other suitable hardware external to the integrated circuit or SoC. The supply voltage may then be decremented (block 705). The method then depends on the detection of a termination condition (block 706). In some embodiments, the termination condition may be when the supply voltage reaches a pre-determined value. When the supply voltage is greater than the pre-determined minimum voltage, the determination of register file oscillator is repeated (block 703).

When the supply voltage is less than or equal to a pre-determined minimum voltage, the method ends (block 907). In some embodiments, the method illustrated in FIG. 7 may be repeated over numerous integrated circuit, SoCs, or process control modules. An analysis may be performed on the resultant data to determine the relationship between supply voltage and speed of operation. In some embodiments, the analysis may include without limitation determination of an average and standard deviation, a probability density function, or any other suitable statistical metric.

The operations depicted in the method illustrated in FIG. 7 are shown being performed sequentially. In other embodiments, some or all of the operations may be performed in parallel.

Figure 8:
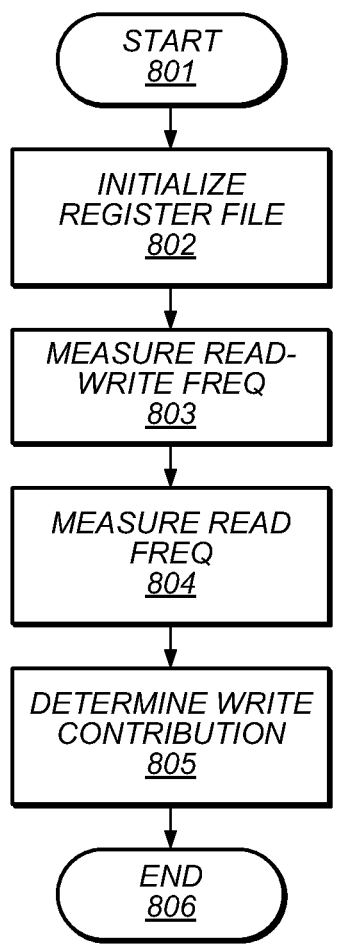
FIG. 8 illustrates a flowchart of an example method for determining the write frequency of a register file.

Turning to FIG. 8, a flowchart of a method for determining the write frequency of a register file is illustrated. Referring collectively to test circuit 600 illustrated in FIG. 6 and the flowchart illustrated in FIG. 8, the method begins in block 801. Register file cells 601 may then be initialized, i.e., known values stored in the register files cells (block 802). The initialization may include the assertion of write enable input 611 as selection index input 610 is incremented through its range of values. Data to be stored in the register files cells may be supplied from a source (not shown) external to test circuit 600.

The frequency of the read-write path through a selected one of register file cells 601 may then be determined (block 803). The determination of the read-write path frequency may include providing a value to selection inputs 610 that may be decoded by decoder 601 to select one of register file cells 601. Write enable input 611 and read enable input 612 may be asserted to activate both the read path and the write path through the previously selected register file cell. Data output from register file cells 601 may then be selected by static multiplexer 602. Inverter 608 may then invert the logical polarity of the selected output data. The inverted data may then be re-written back into the selected register file cell, thereby starting an oscillation through the selected register file cell. Buffer 609 may then amplify the oscillating data and frequency divider 604 may then reduce the frequency of the oscillating data.

Write enable input 611 may then be de-asserted, deactivating the write path through the selected register file cell. The frequency of the read path may then be measured (block 804).

The contribution of the write path to the read-write path frequency may then be determined (block 805). In some embodiments, the difference between the measured read-write path frequency and the read path frequency may be calculated. Other methods of determining the contribution of the write path such as, e.g., Fourier decomposition, may be employed in other embodiments.

While the above description describes the method being performed on a single register file cell, the method may be performed on more than one register file cell (e.g., each of the 64 register file cells included in the register file cells 601) and at multiple power supply voltage levels, and the resultant frequency data analyzed in a statistical fashion. In some embodiments, the statistical analysis may include without limitation, calculation of a mean, calculation of a standard deviation, calculation of a probability density function, and the like.

It is noted that the method illustrated in FIG. 8 is merely an example. In other embodiments, different operations and different orders or operations are possible and contemplated.

Numerous variations and modifications will become apparent to those skilled in the art once the above disclosure is fully appreciated. It is intended that the following claims be interpreted to embrace all such variations and modifications.

What is claimed is:

1. A system, comprising:
   a processing device;
   one or more register files, wherein each one of the one or more register files comprises a plurality of register cells; and
   a test circuit configured to operate the read and write paths of at least one of the one or more register files responsively to a test mode signal;
   wherein the test circuit includes a frequency divider coupled to an output of the selected one of the plurality of data storage cells, wherein the frequency divider is configured to reduce a frequency of data read from a selected one of the plurality of register cells;
   wherein to operate the read and write paths of the at least one of the one or more register files, the test circuit is further configured to:
   invert data read from a given register cell included in the at least one of the one or more register files to generate new data; and
   store the new data in the given register cell.

2. The system of claim 1, wherein each of the plurality of register cells includes a read port and a write port.

3. The system of claim 1, wherein the test circuit comprises a decoder configured to decode a test address, and select a one of the plurality of register cells in response to the decoded test address.

4. The system of claim 1, wherein the test circuit is further configured to access at least one of the plurality of register cells, wherein the read path and the write path of the accessed register cell are both active.

5. The system of claim 1, wherein the frequency divider is coupled to a read port of at least one of the plurality of register cells.

6. An apparatus, comprising:
   a plurality of data storage cells; and
   a test circuit configured to read data from a selected one of the plurality of data storage cells, and store new data dependent on the read data into the selected one of the plurality of data storage cells, while continuing to read data from the selected one of the plurality of data storage cells;
   wherein the test circuit includes a frequency divider coupled to an output of the selected one of the plurality of data storage cells, wherein the frequency divider is configured to reduce a frequency of data read from the selected one of the plurality of data storage cells.

7. The apparatus of claim 6, wherein each of the plurality of data storage cells comprises a multi-port register cell.

8. The apparatus of claim 6, wherein the test circuit comprises a decoder circuit configured to select one of the plurality of data storage cells dependent upon a test address.

9. The apparatus of claim 6, wherein the test circuit is further configured to supply a plurality of power supply voltages to the plurality of data storage cells.

* * * * *